(12) United States Patent
Yano

(10) Patent No.: US 12,198,768 B2
(45) Date of Patent: Jan. 14, 2025

(54) SEMICONDUCTOR DEVICE AND ERASING METHOD

(71) Applicant: Winbond Electronics Corp., Taichung (TW)

(72) Inventor: Masaru Yano, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 331 days.

(21) Appl. No.: 17/695,852

(22) Filed: Mar. 16, 2022

(65) Prior Publication Data

US 2022/0328105 A1 Oct. 13, 2022

(30) Foreign Application Priority Data

Apr. 12, 2021 (JP) ................................ 2021-066942

(51) Int. Cl.
*G11C 16/16* (2006.01)
*G11C 16/04* (2006.01)
(Continued)

(52) U.S. Cl.
CPC .......... *G11C 16/16* (2013.01); *G11C 16/0483* (2013.01); *G11C 16/3445* (2013.01);
(Continued)

(58) Field of Classification Search
CPC . G11C 16/16; G11C 16/0483; G11C 16/3445; G11C 2029/0409; G11C 29/021;
(Continued)

(56) References Cited

U.S. PATENT DOCUMENTS 8,767,477 B2 * 7/2014 Ueno ..................... G11C 16/16
365/185.24
9,064,598 B1 * 6/2015 Hirai .................. G11C 16/0483
(Continued)

FOREIGN PATENT DOCUMENTS

CN 107481756 4/2020
KR 20180022579 3/2018
(Continued)

OTHER PUBLICATIONS

"Office Action of Korea Counterpart Application", issued on Jan. 9, 2024, with English translation thereof, p. 1-p. 9.
(Continued)

*Primary Examiner* — Hoai V Ho
*Assistant Examiner* — Justin Bryce Heisterkamp
(74) *Attorney, Agent, or Firm* — JCIPRNET

(57) ABSTRACT

A semiconductor device and an erasing method may control a number of times an erase pulse. The erasing method of a flash memory includes the following. Multiple sacrificial memory cells in a block are programmed with different write levels first. When a selected block is erased in response to an erase command, a monitor erase pulse (R1) is applied to a well, and then the sacrificial memory cells are verified (S_EV). When the verification fails, a voltage of the monitor erase pulse is increased and then a monitor erase pulse (R2) is applied until the verification of the sacrificial memory cells passes. When the verification is passed, a normal erase pulse (Q1) is applied to the well based on a voltage of the monitor erase pulse (R2) to erase the selected block.

14 Claims, 6 Drawing Sheets

(51) Int. Cl.
*G11C 16/34* (2006.01)
*G11C 29/24* (2006.01)
*G11C 29/04* (2006.01)

(52) U.S. Cl.
CPC ........ *G11C 16/345* (2013.01); *G11C 16/3459* (2013.01); *G11C 16/3468* (2013.01); *G11C 29/24* (2013.01); *G11C 2029/0409* (2013.01)

(58) Field of Classification Search
CPC .. G11C 29/028; G11C 16/345; G11C 16/3459
See application file for complete search history.

(56) References Cited

U.S. PATENT DOCUMENTS

| | | | |
|---|---|---|---|
| 9,299,450 B1* | 3/2016 | Pang | G11C 16/0483 |
| 9,330,773 B2 | 5/2016 | Lim et al. | |
| 2008/0192541 A1* | 8/2008 | Kang | G11C 16/26 |
| | | | 365/185.18 |
| 2012/0201082 A1 | 8/2012 | Choy et al. | |
| 2013/0314995 A1* | 11/2013 | Dutta | G11C 11/5635 |
| | | | 365/185.17 |
| 2014/0104950 A1* | 4/2014 | Yano | G11C 16/10 |
| | | | 365/185.12 |
| 2015/0092491 A1* | 4/2015 | Senoo | G11C 16/16 |
| | | | 365/185.11 |
| 2015/0270004 A1 | 9/2015 | Tsai | |
| 2018/0061496 A1* | 3/2018 | Senoo | G11C 7/04 |
| 2020/0211666 A1 | 7/2020 | Lee | |

FOREIGN PATENT DOCUMENTS

| | | | | |
|---|---|---|---|---|
| KR | 20190079305 A | * | 7/2019 | ............. G11C 16/16 |
| TW | 201137886 | | 11/2011 | |
| TW | 201415461 | | 4/2014 | |
| TW | 201911057 | | 3/2019 | |
| TW | 201939507 | | 10/2019 | |

OTHER PUBLICATIONS

"Office Action of Taiwan Counterpart Application", issued on Dec. 2, 2022, p. 1-p. 9.

* cited by examiner

SEMICONDUCTOR DEVICE AND ERASING METHOD

CROSS-REFERENCE TO RELATED APPLICATION

This application claims the priority benefit of Japanese application serial no. 2021-066942, filed on Apr. 12, 2021. The entirety of the above-mentioned patent application is hereby incorporated by reference herein and made a part of this specification.

BACKGROUND

Technical Field

The disclosure relates to a semiconductor device of a flash memory, in particular to an erasing method of a NAND flash memory.

Description of Related Art

In a typical flash memory, when data is programmed, electrons are accumulated in the floating gate, shifting the threshold voltage of the memory cell in the positive direction; when data is erased, electrons are released from the floating gate, shifting the threshold voltage of the memory cell in the negative direction. Such programming and erasing must be controlled so that the thresholds of the memory cells fall within the distribution width of "0" and "1". In addition, if the memory cell stores multiple bits, the threshold value of the memory cell must be further controlled to fall within the distribution width of "00", "01", "10", and "11".

To control the threshold distribution of the memory cells, the memory cells are erased using incremental step pulse erase (ISPE). As shown in FIG. 1A, the ISPE applies an erase pulse Vers0 to the P-type well of the selected block, and if the verification of the erasing fails, applies an erase pulse Vers1 at a step voltage higher than the erase pulse Vers0, so that the voltage of the erase pulse increases until the erasing of all of the memory cells in the block is judged to be passed.

The same applies to programming. To accurately inject electrons into the memory cells, incremental step pulse program (ISPP) can be used. As shown in FIG. 1B, the ISPP applies a program pulse Vpgm0 to a selected page, and if the verification of the programming fails, applies a program pulse Vpgm1 at a step voltage higher than the program pulse Vpgm0, so that the voltage of the program pulse increases until the programming of all of the memory cells in the page is judged to be passed.

SUMMARY

FIG. 2 is a graph showing cycle characteristics of program/erase, wherein, a vertical axis is a threshold (Vth) of a memory cell, and a horizontal axis is a number of cycles of program/erase. Upper lines are the threshold of memory cells in a programmed state, and lower lines are the threshold of memory cells in an erased state. The cycle characteristics of four products of different generations are shown here. The cycle characteristics of program/erase are obtained, for example, by repeatedly applying a program pulse with a certain voltage and an erase pulse with a certain voltage.

As the number of the cycle of program/erase increases, deterioration of Gm (transconductance) becomes more pronounced, making it difficult for current to flow in the memory cells. The result, as shown in this figure, since the number of cycle exceeds about 1,000, the threshold gradually shifts to the positive direction. Since the memory cell is programmed to raise the threshold, the increase in the number of the cycle makes the program easier, i.e. faster. If a program verification voltage is the same, the program verification passes with a lower voltage of the program pulse, but during the program operation, a large stress is applied to the memory cell, which accelerates the deterioration of the Gm of the memory cell.

On the other hand, since the memory cell is erased to reduce the threshold, the increase in the number of the cycle makes erasing difficult, i.e. slower. Ideally, the erasing times of the erase pulse can be can be controlled by using ISPE. However, if the erasing speed of the memory decreases due to the increase in the number of the cycle, the number of times the erase pulse is applied increases, the number of applying stress on the memory cell increases, the deterioration of the Gm of the memory cell accelerates, and eventually an endurance characteristic (a number of times the data can be rewritten) and data retention characteristics decrease. In addition, memory cells that are relatively easy to be erased are subject to over erase. On the contrary, for memory cells that are difficult to be erased, the erase voltage is too small and the offset of the threshold is too small, which causes the threshold of the memory cell to easily deviate from the threshold distribution. Furthermore, in ISPE, if the erase verification fails even after a maximum number of erase pulse is applied, the block is managed as a bad block, and available storage capacity is limited.

The disclosure provides a semiconductor device capable of controlling a number of times an erase pulse is applied and an erasing method thereof.

An erasing method of a NAND flash memory of the disclosure includes the following: Multiple sacrificial memory cells in a block are programmed with different write levels. A monitor erase pulse is applied to a well when a selected block is erased in response to an erase command. A verification is conducted on the sacrificial memory cells. When the verification fails, a voltage of the monitor erase pulse is increased and then the monitor erase pulse is applied until the verification of the sacrificial memory cells passes. When the verification is passed, an erase pulse is applied to the well based on the voltage of the monitor erase pulse to erase the selected block.

In one embodiment, the sacrificial memory cells are respectively programmed to different write levels using a program pulse used during program operation before erasing. In one embodiment, the sacrificial memory cells enable a set program pulse to be programmed according to a number of a cycle of program/erase. In one embodiment, the sacrificial memory cells include a first sacrificial memory cell programmed with a first write level and a second sacrificial memory cell programmed with a second write level, and the second write level is greater than the first write level. An increase in the voltage of the monitor erase pulse when the first sacrificial memory cell and the second sacrificial memory cell fail is greater than an increase in the voltage when the first sacrificial memory cell passes and the second sacrificial memory cell fails. In one embodiment, a voltage of the erase pulse is set based on the voltage of the monitor erase pulse when the first sacrificial memory cell and the second sacrificial memory cell pass. In one embodiment, the monitor erase pulse is a voltage waveform skewed compared to the erase pulse. In one embodiment, the sacrificial memory cells are programmed after the selected block is erased. In one embodiment, the sacrificial memory cells are programmed after a selected page is programmed.

Furthermore, an erasing method of a NAND flash memory erasing by ISPE of the disclosure includes the followings. Multiple sacrificial memory cells are programmed with different write levels using a program pulse during program operation before erasing. A monitor erase pulse is applied to a well when a selected block is erased, and an offset of a threshold of the sacrificial memory cells is monitored. An erase pulse is determined for erasing the selected block based on a monitoring result.

A semiconductor device of the disclosure include a NAND memory cell array, in which a block of the memory cell array includes multiple sacrificial memory cells, and an erasing component erasing a selected block of the NAND memory cell array. The erasing component programs the sacrificial memory cells with different write levels, applies a monitor erase pulse to a well when the selected block is erased in response to an erase command, and then conducts a verification on the sacrificial memory cells. When the verification fails, a voltage of the monitor erase pulse is increased and then the monitor erase pulse is applied until the verification of the sacrificial memory cells passes, and when the verification is passed, an erase pulse is applied to the well based on the voltage of the monitor erase pulse to erase the selected block.

In one embodiment, the erasing component programs the sacrificial memory cells according to a program pulse set based on a number of a cycle of program/erase. In one embodiment, the sacrificial memory cells include a first sacrificial memory cell programmed with a first write level and a second sacrificial memory cell programmed with a second write level, the second write level is greater than the first write level, and the erasing component enables an increase in the voltage of the monitor erase pulse when the first sacrificial memory cell and the second sacrificial memory cell fail to be greater than an increase in the voltage when the first sacrificial memory cell passes and the second sacrificial memory cell fails. In one embodiment, the erasing component sets a voltage of the erase pulse based on the voltage of the monitor erase pulse when the first sacrificial memory cell and the second sacrificial memory cell pass. In one embodiment, the erasing component programs the sacrificial memory cells after the selected block is erased. In one embodiment, the sacrificial memory cells are disposed in a region of the NAND memory cell array not used by a user. In one embodiment, the semiconductor device further includes a setting information storage part, the setting information storage part stores setting information about ISPE and setting information about ISPP, and the erasing component determines a voltage for programming the sacrificial memory cells and a voltage for erasing the block with reference to the setting information storage part.

According to the disclosure, since the monitor erase pulse is applied to monitor multiple sacrificial memory cells to optimize the voltage of the erase pulse, erasing may be performed without significantly increasing the number of times the erase pulse is applied, even if the number of the cycle of program/erase increases. As a result, the stress on the memory cells may be reduced, Gm deterioration of the memory cell may be suppressed, and the endurance characteristics and data retention characteristics of the memory cell may be improved.

To make the aforementioned more comprehensible, several accompanied with drawings are described in detail as follows.

BRIEF DESCRIPTION OF THE DRAWING

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Next, the following is a detailed description of how the disclosure is implemented with reference to the accompanying drawings. A semiconductor device of the disclosure is, for example, a NAND flash memory, or a microprocessor, a microcontroller, logic integrated circuit, application specific integrated circuit (ASIC), a processor for processing graphics and sound, and a processor for processing signals such as wireless signals embedded in such flash memory. In the following description, a NAND flash memory is shown. In one embodiment, the NAND flash memory may be equipped with a Serial Peripheral Interface (SPI) to achieve compatibility with a NOR flash memory.

[Embodiment]

Figure 1A:
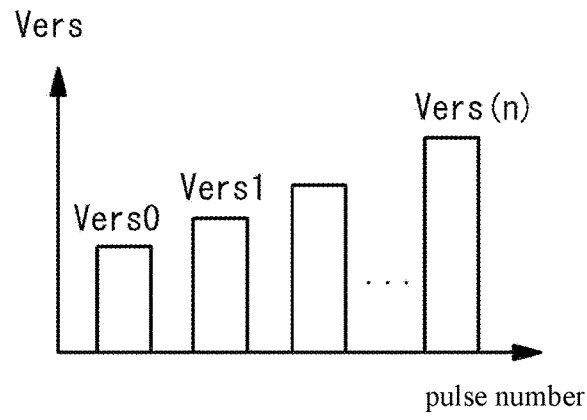
FIG. 1A and FIG. 1B are diagrams showing erasing of a conventional flash memory using ISPE.
Figure 1B:
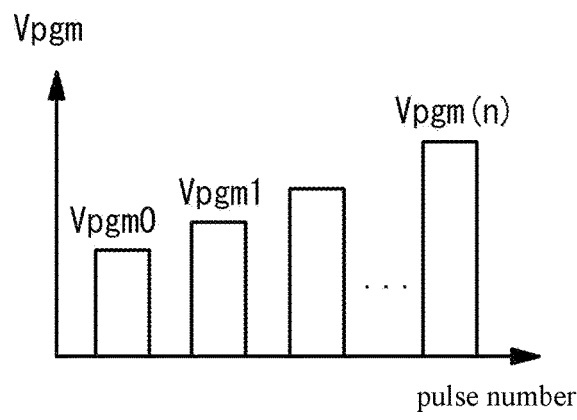
Figure 2:
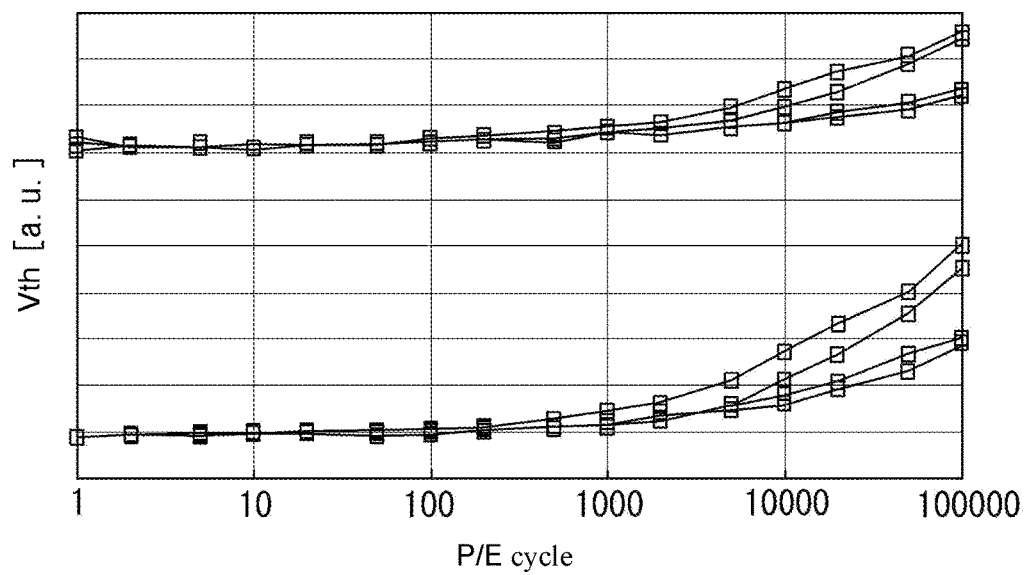
FIG. 2 is a graph showing relationship between cycles of program/erase and threshold changes.
Figure 3:
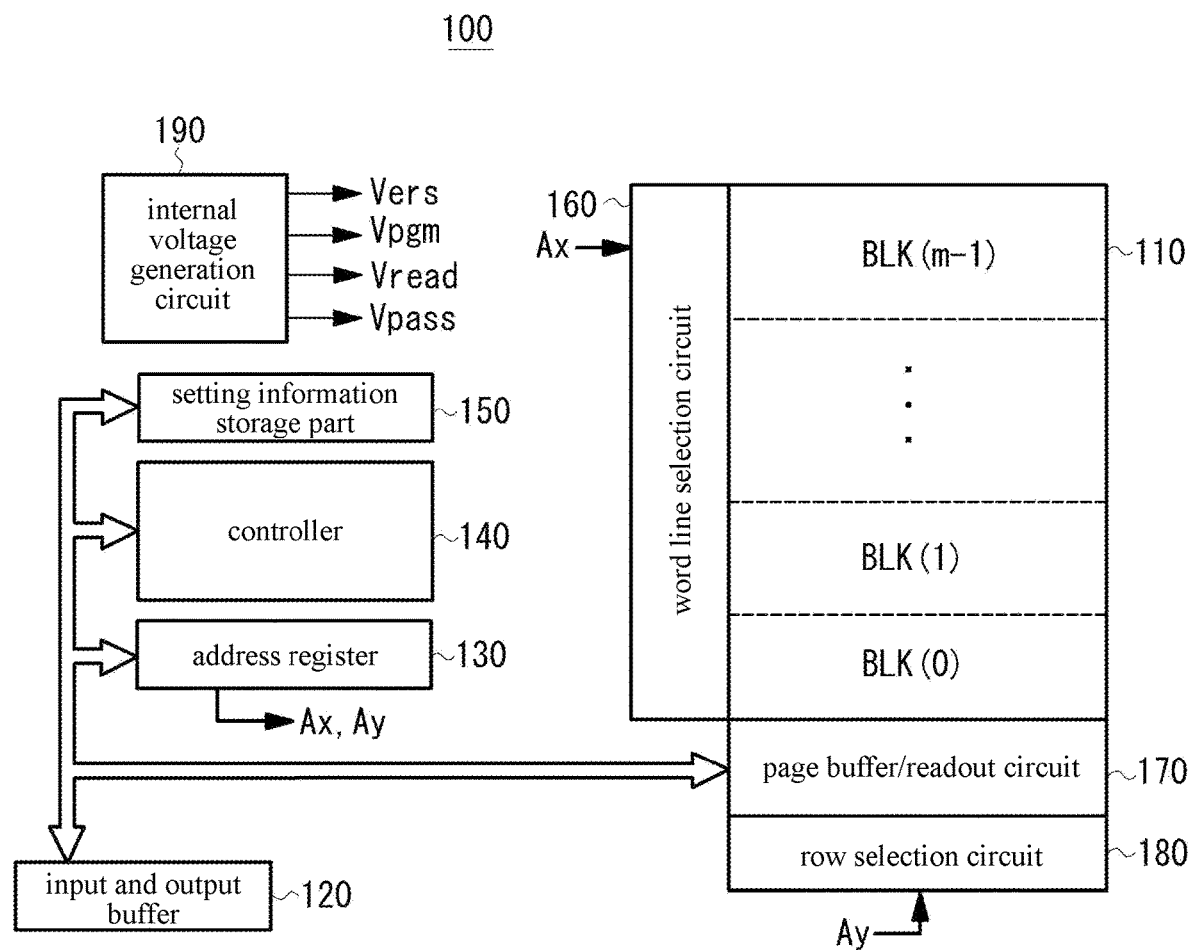
FIG. 3 is a block diagram showing a structure of a NAND flash memory according to an embodiment of the disclosure.

FIG. 3 is a block diagram showing a structure of a NAND flash memory according to an embodiment of the disclosure. A flash memory 100 according to this embodiment includes the followings. A memory cell array 110 arranges multiple memory cells into a matrix. An input and output buffer 120 outputs a readout data to the external, or imports a data input from the external. An address register 130 receives an address data through the input and output buffer 120. A controller 140 controls each part based on a command data received through the input and output buffer 120 or a control signal applied to an external terminal. A setting information storage part 150 stores setting information about ISPE and ISPP. A word line selection circuit 160 performs block selection and word line selection based on column address information Ax from the address register 130. A page buffer/readout circuit 170 holds data read out from a selected page of the memory cell array 110, or holds data for programming in the selected page. A row selection circuit 180 performs row selection, etc. in the page buffer/readout circuit 170 based on row address information Ay from the address register 130. An internal voltage generation circuit 190 generates various voltages (program voltage Vpgm, pass voltage Vpass, readout voltage Vread, erase voltage Vers, etc.) required for readout, program, and erase.

Figure 4:
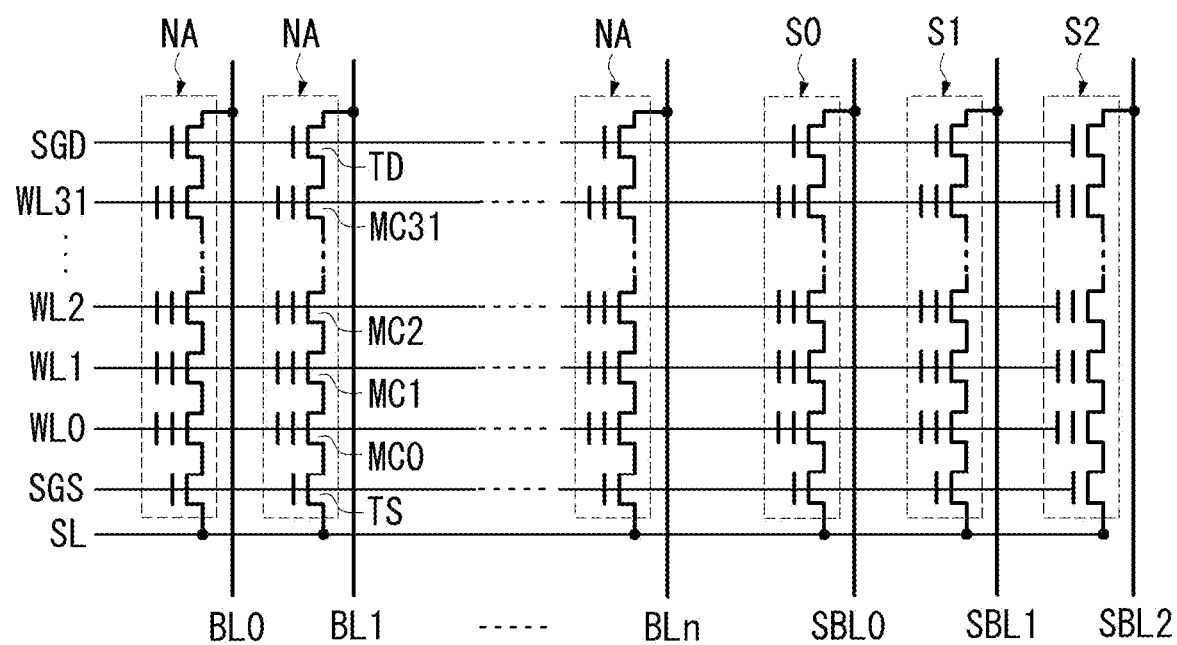
FIG. 4 is a diagram showing a structure of a NAND memory cell and a sacrificial memory cell in a block according to an embodiment of the disclosure.

The memory cell array 110 has, for example, m blocks BLK disposed in a row direction, as shown in FIG. 4. Multiple NAND memory cells NA are formed in each of the blocks. One NAND memory cell includes multiple memory cells (MC0, MC1, . . . , MC31), a bit line side selection transistor TD, and a source line side selection transistor TS connected in series. A drain of the bit line side selection transistor TD is connected to a corresponding bit line, and a source of the source line side selection transistor TS is connected to a common source line SL. A gate of each of the memory cells is connected to a word line. Each of gate of the bit line side selection transistor TD and the source line side selection transistor TS is connected to a select gate line SGD and a select gate line SGS. A word line WL, the select gate line SGD, and select gate line SGS are driven by the word line selection circuit 160. In addition, each of bit line BL0, BL1, and BLn are connected to the page buffer/readout circuit 170 through a bit line selection circuit for selecting an even bit line or an odd bit line.

The block according to this embodiment is further provided with multiple sacrificial memory cells S0, S1, and S2 for monitoring an offset of a threshold of the memory cells during erasing operation. The sacrificial memory cells S0, S1, and S2 are constructed in the same manner as the NAND memory cells NA, but the sacrificial memory cells are formed in a region not used by a user or a region not accessible to a user. The sacrificial memory cells S0, S1, and S2 are connected to the page buffer/readout circuit 170 in the same way as the other NAND memory cells NA through corresponding bit line SBL0, bit line SBL1, and bit line SBL2. In addition, three sacrificial memory cells S0, S1, S2 are shown here, but a number of the sacrificial memory cells is not limited thereto.

The setting information storage part 150 stores an initial value of an erase pulse Vers_init, a step voltage, a maximum number of times the erase pulse is applied, etc. as the setting information about ISPE. In addition, the setting information storage part 150 stores an initial value of a program pulse Vpgm_init, the step voltage, a maximum number of times the program pulse is applied, etc. as the setting information about ISPP. In one embodiment, the setting information may be loaded from a fuse memory where setting information about the operation of the flash memory is stored during power-on operation. The controller 140 determines the initial voltage and step voltage of the erase pulse and the program pulse during the erasing operation and program operation with reference to the setting information stored in the setting information storage part 150. Further, the controller 140 dynamically changes the initial voltage and the step voltage of the erase pulse and the program pulse according to a number of a cycle of program/erase, and updates the setting information storage part 150 with changed setting information.

The word line selection circuit 160 drives the memory cells through the word line WL based on the column address Ax, and drives the bit line side selection transistor and the source line side selection transistor through the select gate line SGD and the select gate line SGS to select block and page. The row selection circuit 180 selects the bit line according to the row address Ay, for example, to select the readout start position of data in the page.

The controller 140 uses a microcontroller or a state machine, etc. to constitute a read only memory (ROM)/random access memory (RAM), etc. to control the operation of the flash memory 100. During readout operation, a certain positive voltage is applied to the bit line, a certain voltage (e.g., 0 V) is applied to a selected word line, a pass voltage (e.g., 4.5 V) is applied to an unselected word line, the bit line side selection transistor and the source line side selection transistor are turned on, and 0 V is applied to a common source line. During the program operation, a high-voltage program voltage Vpgm (15 V to 20 V) is applied to the selected word line, and an intermediate potential (e.g., 10 V) is applied to the unselected word line to turn on the bit line side selection transistor and to turn off the source line side selection transistor, and potential corresponding to the "0" or "1" data is supplied to the bit line. During the erasing operation, 0 V is applied to the selected word line in the block, and a high voltage Vers (e.g., 20 V) is applied to a P-type well, and electrons of a floating gate are withdrawn to the substrate, thus erasing the data on a block-by-block basis.

Next, the following is a description of the erasing operation according to this embodiment. In this embodiment, before the selected block is performed substantial erasing, a monitor erase pulse is applied to monitor the offset of the threshold of the sacrificial memory cells S0, S1, and S2 at this time. Based on the monitoring result, a voltage of the erase pulse for substantial erasing is determined, and the erase pulse is applied to the selected block in accordance with ISPE.

The sacrificial memory cells S0, S1, and S2 are programmed with different write levels before being erased. The number of the sacrificial memory cells (number of bits) is not specifically limited, e.g., by the type of the write level and the number of pages in the block. For example, in the case of programming with three write levels, at least three (three bits) sacrificial memory cells are required. In the case of monitoring for production tolerance, etc., multiple sacrificial memory cells may be prepared for one write level. In addition, the block may be programmed for the number of times corresponding to the number of pages, and the sacrificial memory cells may also be set to a size corresponding to the number of time of the program in the block.

Figure 5A:
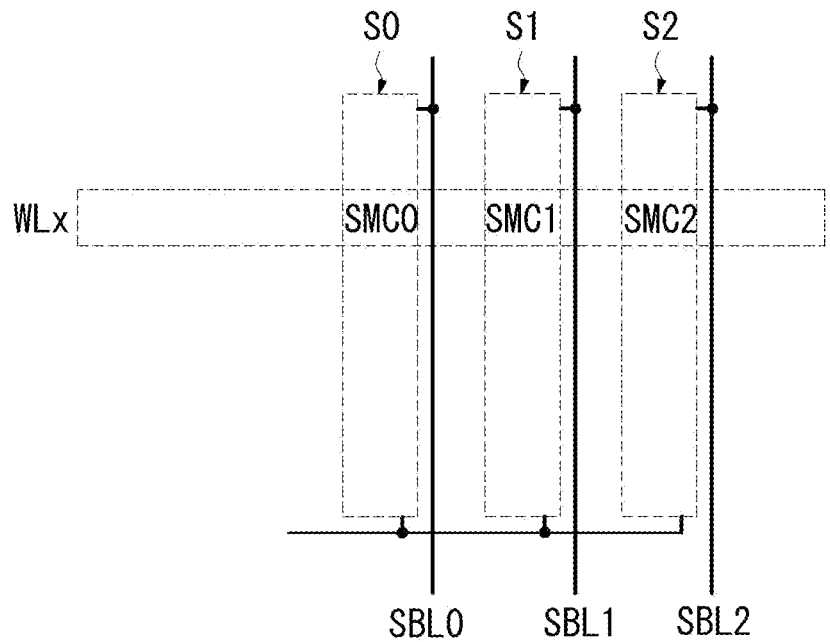
FIG. 5A and FIG. 5B are diagrams showing a program of a sacrificial memory cell according to an embodiment of the disclosure.

Here, an example of programming in three sacrificial memory cells S0, S1, and S2 with three write levels L0, L1, and L2 as shown in FIG. 5A is described. When programming, the sacrificial memory cells S0, S1, S2 are in the erased state. The controller 140 selects a word line Wx, and programs in sacrificial memory cells SMC0, SMC1, and SMC2 on the same page of the sacrificial memory cells S0, S1, and S2 with the write level L0, the write level L1, and the write level L2.

Figure 5B:
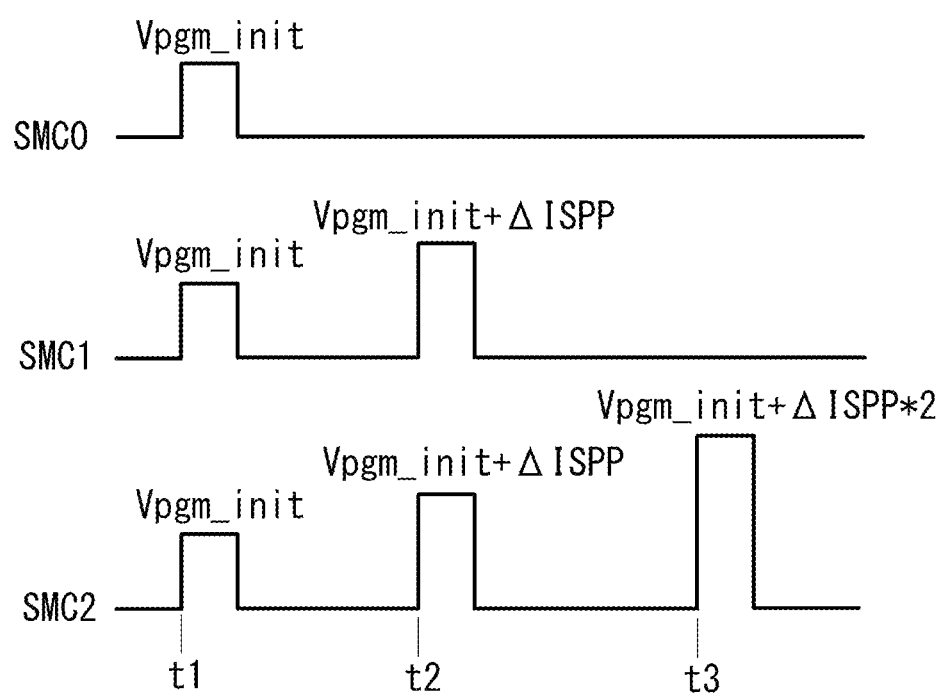

FIG. 5B is a schematic diagram showing that a program voltage is applied to the sacrificial memory cell SMC0, the sacrificial memory cell SMC1, and the sacrificial memory cell SMC2. At time t1, a program voltage Vpgm_init is applied to a word line WLx, and at this time, a voltage of data "0" is applied to the bit line SBL0, the bit line SBL1, and the bit line SBL2 of the sacrificial memory cells S0, S1, and S2. As a result, the sacrificial memory cells SMC0, SMC1, and SMC2 are programmed. Next, at time t2, a program voltage Vpgm_init+ΔISPP (ΔISPP is a step voltage) is applied to the word line WLx, and at this time, a program-disable voltage is applied to the bit line SBL0, and the voltage of data "0" is applied to the bit line SBL1 and the bit line SBL2. As a result, the sacrificial memory cells SMC1 and SMC2 are programmed. At time t3, Vpgm_init+ ΔISPP*2 is applied to the word line WLx, and at this time, the program-disable voltage is applied to the sacrificial memory cells SMC0 and SMC1, and the voltage of data "0" is applied to the bit line SBL2. As a result, the sacrificial memory cell SMC2 is programmed. In this way, the sacrificial memory cells SMC0, SMC1, and SMC2 are programmed with the write level L0, the write level L1, and the write level L2 (L0<L1<L2), and the threshold of each of the sacrificial memory cells is shifted in a positive direction corresponding to the write levels.

The program voltage for programming the sacrificial memory cells is determined based on the setting information about ISPP stored in the setting information storage part 150. The controller 140, when programming the pages in the block, refers to the program voltage (including the initial voltage and the step voltage) of the ISPP stored in the setting information storage part 150. In addition, the controller 140 may dynamically change the program voltage when programming the pages. For example, the program speed of a selected memory cell is sometimes monitored before programming, and based on this monitoring result, the program voltage is reduced, or the step voltage is made variable. This monitoring takes into account an increase in the threshold caused by an increase in the number of the cycle of program/erase. When such a dynamic change of the program voltage is performed, the controller 140 changes or updates the setting information about ISPP in the setting information storage part 150.

In addition, the controller 140 selects a new word line WLx when programming the pages in the block in a different time sequence, and programs the sacrificial memory cell using the program pulse applied in the latest page programming. The controller 140 stores information of the latest word line WLx when the sacrificial memory cell is programmed in association with the setting information storage part 150.

Figure 6:
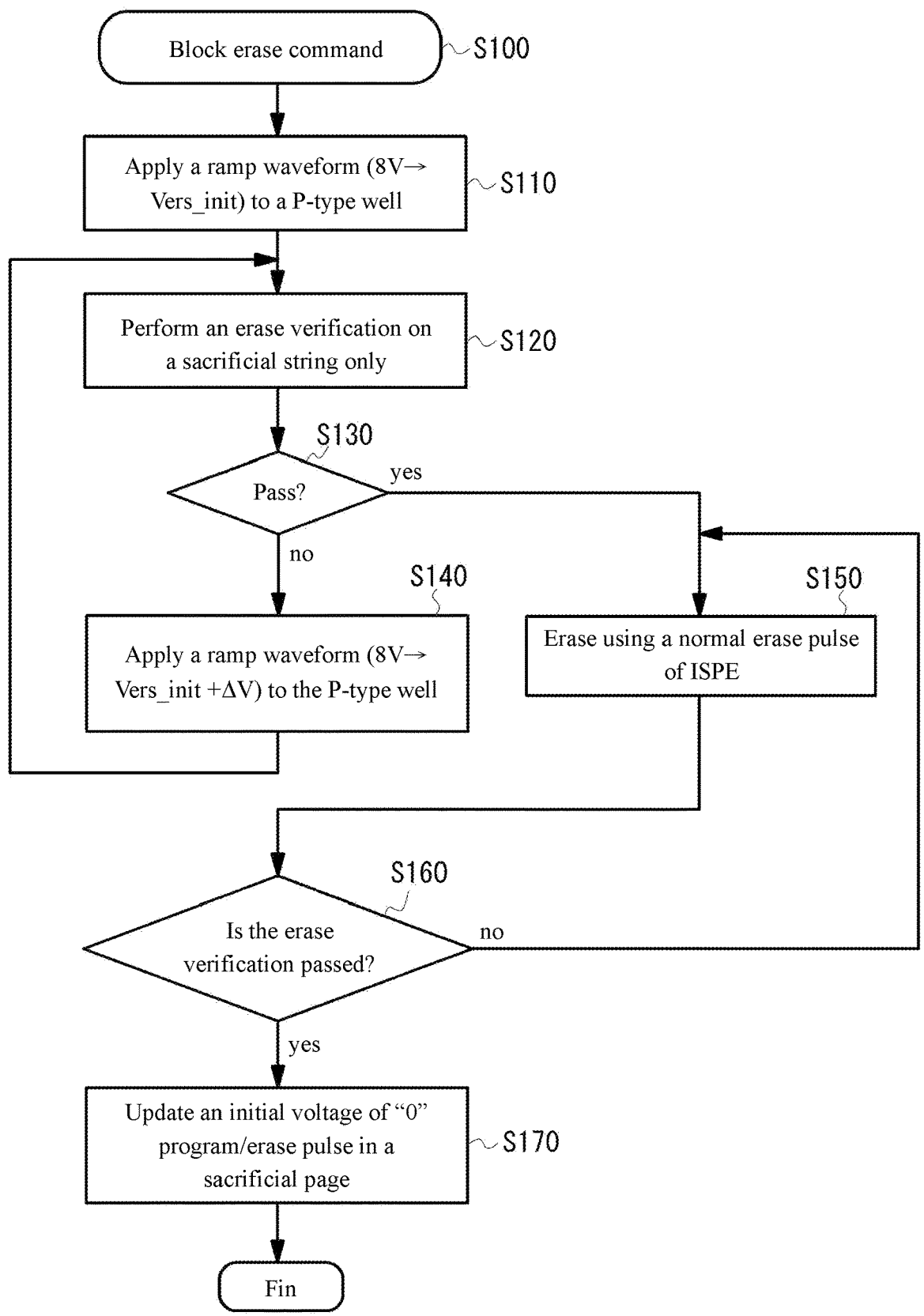
FIG. 6 is a flowchart showing erasing operation according to an embodiment of the disclosure.
Figure 7:
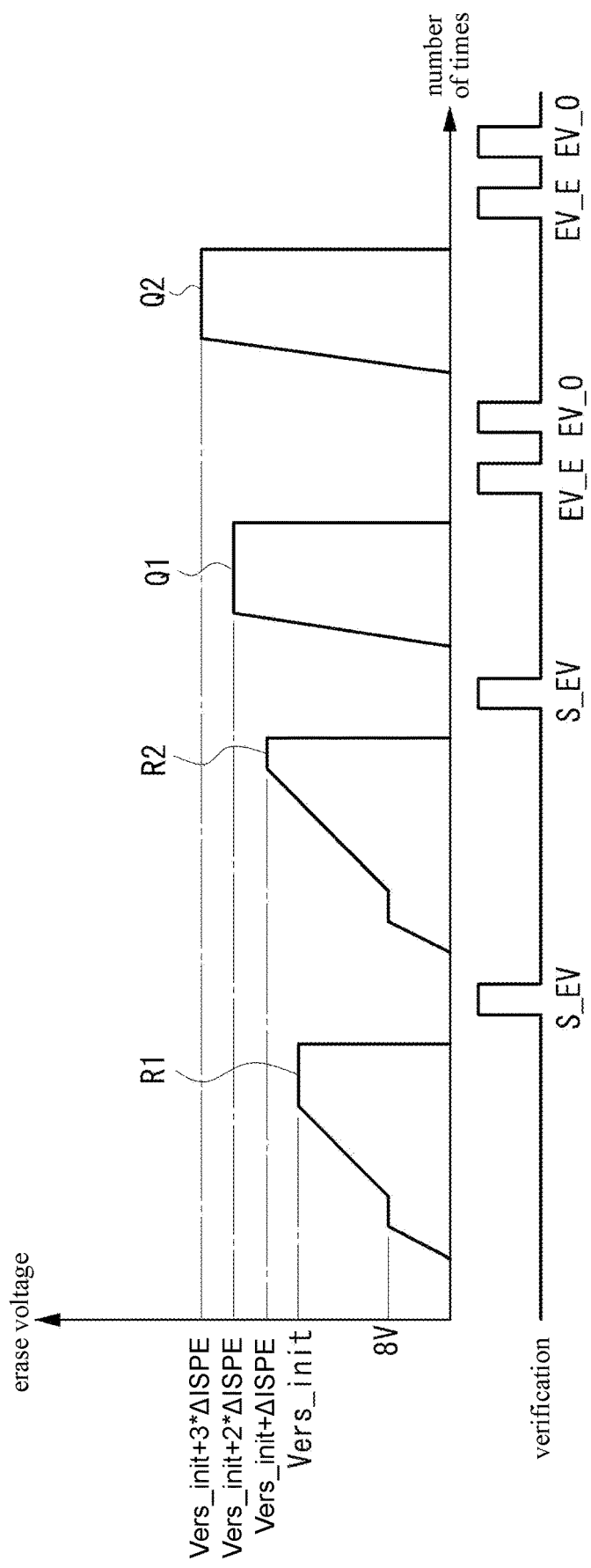
FIG. 7 is an example of waveforms of erase pulses based on ISPE according to an embodiment of the disclosure.

FIG. 6 is a flowchart showing erasing operation according to an embodiment of the disclosure. FIG. 7 is a diagram showing waveforms of the erase pulses applied to a P-type well during the erasing operation. The controller 140 starts an erase sequence of a block in response to an erase command (S100). The controller 140 starts the erase sequence in response to, for example, receiving an erase command and address from the outside, or in response to an internal erase command such as an internal garbage collection.

The controller 140 first enables the word line of the selected block to become a GND level, and applies a ramp waveform R1 as shown in FIG. 7 to the P-type well as the monitor erase pulse. The ramp waveform R1 is not intended for erasing, but for monitoring the offset of the threshold of the sacrificial memory cells, and is therefore adjusted to a voltage waveform with less energy than the normal erase pulse, so that the threshold of the sacrificial memory cells does not rapidly become negative. In the example in the figure, after the ramp waveform R1 increases from GND to a certain voltage (e.g., 8 V), the voltage increase is skewed from the certain voltage to the initial voltage Vers_init. In addition, the initial voltage Vers_init is determined with reference to the setting information about ISPP stored in the setting information storage part 150.

After applying the ramp waveform R1, the controller 140 performs a verification of the sacrificial memory cells S1, S2, and S3 (S110). It should be noted here that only the sacrificial memory cells are verified. The threshold of the sacrificial memory cells SMC0, SMC1, and SMC2 is shifted in a negative direction by applying the monitor erase pulse, and the verification is performed to verification whether the threshold of the sacrificial memory cells SMC0, SMC1, and SMC2 has reached a determined value (e.g., 0 V), and if so, the verification is passed. During the verification readout, a certain voltage is applied to the selected word line of the selected block, and a readout pass voltage is applied to the unselected word line other than the selected word line. S_EV of FIG. 7 shows a time sequence of the verification of the sacrificial memory cells.

When the verification of all of the sacrificial memory cells S1, S2, and S3 passes (S130), the controller 140 applies a normal erase pulse based on ISPE for the purpose of erasing to the P-type well, and starts to erase the selected block (S150). If all of the sacrificial memory cells S1, S2, S3 pass by applying the ramp waveform R1 once, a peak value of the erase pulse is Vers_init+ΔISPE, and the erase pulse at this time rises rapidly from GND to the peak value.

When the verification fails, the controller 140 increases the voltage of the monitor erase pulse and applies the monitor erase pulse to the P-type well (S140). The amount of increase in the step voltage depends on whether the sacrificial memory cells SMC0, SMC1, and SMC2 are passed or not. If the sacrificial memory cell MC0 passes but both the sacrificial memory cells SMC1 and SMC2 fail, a voltage of a next monitor erase pulse is set to Vers_init+2*ΔISPE (the step voltage is increased by two times); if only the sacrificial memory cell SMC2 fails, the voltage of the next monitor erase pulse is set to Vers_init+ΔISPE. A ramp waveform R2 in FIG. 7 represents the erase voltage Vers_init+ΔISPE when only the sacrificial memory cell SMC2 fails.

After the ramp waveform R2 is applied, the verification of the sacrificial memory cells is performed again (S120), and this routine continues until all of the sacrificial memory cells pass. An erase pulse Q1 in FIG. 7 represents a waveform when the verification is passed after applying the ramp waveform R2, and the peak value of the erase pulse Q1 is Vers_init+2*ΔISPE.

After the erase pulse Q1 is applied, an erase verification is performed (S160). EV_E of FIG. 7 shows the verification of an even bit line, and EV_O shows the verification of or an odd bit line. If the erase verification fails, the controller 140 applies the erase pulse Q2 to the P-type well after increasing the erase pulse by the step voltage to erase the selected block (S150). The peak value of the erase pulse Q2 is Vers_init+3*ΔISPE. This routine continues until the verification of all of the bit lines in the selected block passes.

If the erase verification is passed, the controller 140 programs the sacrificial memory cells with different write levels with reference to the setting information about ISPP in the setting information storage part 150. In addition, the controller 140 saves or updates the initial voltage of the erase pulse as the setting information about ISPE in the setting information storage part 150 (S170).

As described above, according to this embodiment, the offset of the threshold of the sacrificial memory cells in the selected block is set to be monitored during the erasing operation, and the erase pulse is applied based on the monitoring result, so that the increase in the number of the erase pulse applied due to the increase in the number of the cycle of program/erase may be suppressed, thus reducing the stress on the memory cells and minimizing Gm deterioration.

In the embodiment, program with three different write levels are set to perform in the sacrificial memory cells, but not limited thereto. The program may also be set to perform with two or more than four write levels.

It will be apparent to those skilled in the art that various modifications and variations can be made to the disclosed without departing from the scope or spirit of the disclosure. In view of the foregoing, it is intended that the disclosure covers modifications and variations provided that they fall within the scope of the following claims and their equivalents.

What is claimed is:

1. An erasing method of a NAND flash memory, comprising:
    programming a plurality of sacrificial memory cells in a block with different write levels;
    applying a monitor erase pulse to a well when a selected block is erased in response to an erase command;
    conducting a verification on the sacrificial memory cells;
    when the verification fails, increasing a voltage of the monitor erase pulse and then applying the monitor erase pulse until the verification of the sacrificial memory cells passes; and
    when the verification is passed, applying an erase pulse to the well based on the voltage of the monitor erase pulse to erase the selected block,
    wherein the sacrificial memory cells comprise a first sacrificial memory cell programmed with a first write level and a second sacrificial memory cell programmed with a second write level, and the second write level is greater than the first write level,
    an increase in the voltage of the monitor erase pulse when the first sacrificial memory cell and the second sacrificial memory cell fail is greater than an increase in the voltage when the first sacrificial memory cell passes and the second sacrificial memory cell fails.

2. The erasing method according to claim 1, wherein the sacrificial memory cells are respectively programmed to different write levels using a program pulse used during a program operation before erasing.

3. The erasing method according to claim 1, wherein the sacrificial memory cells enable a set program pulse to be programmed according to a number of a cycle of program/erase.

4. The erasing method according to claim 1, wherein a voltage of the erase pulse is set based on the voltage of the monitor erase pulse when the first sacrificial memory cell and the second sacrificial memory cell pass.

5. The erasing method according to claim 1, wherein the monitor erase pulse is a voltage waveform skewed compared to the erase pulse.

6. The erasing method according to claim 1, wherein the sacrificial memory cells are programmed after the selected block is erased.

7. The erasing method according to claim 1, wherein the sacrificial memory cells are programmed after a selected page is programmed.

8. An erasing method of a NAND flash memory erasing by incremental step pulse erase, comprising,
    programming a plurality of sacrificial memory cells with different write levels using a program pulse during a program operation before erasing,
    applying a monitor erase pulse to a well when a selected block is erased, and monitoring an offset of a threshold of the sacrificial memory cells,
    determining an erase pulse for erasing the selected block based on a monitoring result,
    wherein the sacrificial memory cells comprise a first sacrificial memory cell programmed with a first write level and a second sacrificial memory cell programmed with a second write level, and the second write level is greater than the first write level,
    an increase in the voltage of the monitor erase pulse when the first sacrificial memory cell and the second sacrificial memory cell fail is greater than an increase in the voltage when the first sacrificial memory cell passes and the second sacrificial memory cell fails.

9. A semiconductor device, comprising:
    a NAND memory cell array, wherein a block of the NAND memory cell array comprises a plurality of sacrificial memory cells; and
    an erasing component erasing a selected block of the NAND memory cell array, wherein the erasing component programs the sacrificial memory cells with different write levels, applies a monitor erase pulse to a well when the selected block is erased in response to an erase command, and then conducts a verification on the sacrificial memory cells, wherein when the verification fails, a voltage of the monitor erase pulse is increased and then the monitor erase pulse is applied until the verification of the sacrificial memory cells passes, and when the verification is passed, an erase pulse is applied to the well based on the voltage of the monitor erase pulse to erase the selected block,
    wherein the sacrificial memory cells comprise a first sacrificial memory cell programmed with a first write level and a second sacrificial memory cell programmed with a second write level, the second write level is greater than the first write level, and the erasing component enables an increase in the voltage of the monitor erase pulse when the first sacrificial memory cell and the second sacrificial memory cell fail to be greater than an increase in the voltage when the first sacrificial memory cell passes and the second sacrificial memory cell fails.

10. The semiconductor device according to claim 9, wherein the erasing component programs the sacrificial memory cells according to a program pulse set based on a number of a cycle of program/erase.

11. The semiconductor device according to claim 9, wherein the erasing component sets a voltage of the erase pulse based on the voltage of the monitor erase pulse when the first sacrificial memory cell and the second sacrificial memory cell pass.

12. The semiconductor device according to claim 10, wherein the erasing component programs the sacrificial memory cells after the selected block is erased.

13. The semiconductor device according to claim 9, wherein the sacrificial memory cells are disposed in a region of the NAND memory cell array not used by a user.

14. The semiconductor device according to claim 9, wherein the semiconductor device further comprises a setting information storage part, the setting information storage part stores setting information about incremental step pulse erase and setting information about incremental step pulse program, and the erasing component determines a voltage for programming the sacrificial memory cells and a voltage for erasing the block with reference to the setting information storage part.

* * * * *